United States Patent
Kourtakis et al.

(10) Patent No.: US 11,021,606 B2
(45) Date of Patent: Jun. 1, 2021

(54) MULTILAYER FILM FOR ELECTRONIC CIRCUITRY APPLICATIONS

(71) Applicant: E I DU PONT DE NEMOURS AND COMPANY, Wilmington, DE (US)

(72) Inventors: Kostantinos Kourtakis, Media, PA (US); Rosa Irene Gonzalez, Pearland, TX (US); Herbert W Lim, Columbus, OH (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 135 days.

(21) Appl. No.: 16/115,960

(22) Filed: Aug. 29, 2018

(65) Prior Publication Data
US 2019/0077959 A1 Mar. 14, 2019

Related U.S. Application Data

(60) Provisional application No. 62/557,901, filed on Sep. 13, 2017.

(51) Int. Cl.
| | |
|---|---|
| *C08L 79/08* | (2006.01) |
| *C08J 5/12* | (2006.01) |
| *H05K 1/03* | (2006.01) |
| *C08J 5/18* | (2006.01) |
| *B32B 15/20* | (2006.01) |
| *B32B 27/28* | (2006.01) |
| *H05K 3/02* | (2006.01) |
| *H05K 3/00* | (2006.01) |

(52) U.S. Cl.
CPC .............. *C08L 79/08* (2013.01); *B32B 15/20* (2013.01); *B32B 27/281* (2013.01); *C08J 5/12* (2013.01); *C08J 5/18* (2013.01); *H05K 1/036* (2013.01); *H05K 1/0393* (2013.01); *B32B 2250/03* (2013.01); *B32B 2250/04* (2013.01); *B32B 2250/05* (2013.01); *B32B 2307/412* (2013.01); *B32B 2457/08* (2013.01); *C08J 2379/08* (2013.01); *C08J 2479/08* (2013.01); *C08L 2205/025* (2013.01); *C08L 2205/03* (2013.01); *H05K 3/0014* (2013.01); *H05K 3/022* (2013.01); *H05K 2201/0129* (2013.01); *H05K 2201/0154* (2013.01); *H05K 2201/0195* (2013.01); *H05K 2201/068* (2013.01)

(58) Field of Classification Search
CPC ... B32B 15/20; B32B 27/281; B32B 2250/03; B32B 2250/04; B32B 2250/05; B32B 2307/412; B32B 2457/08; C08J 5/12; C08J 5/18; C08J 2379/08; C08J 2479/08; C08L 79/08; C08L 2205/025; C08L 2205/03; H05K 1/036; H05K 1/0393; H05K 2201/0129; H05K 2201/0154; H05K 2201/0195; H05K 2201/068; H05K 3/0014; H05K 3/022

See application file for complete search history.

(56) References Cited

U.S. PATENT DOCUMENTS

| | | | |
|---|---|---|---|
| 3,410,826 | A | 11/1968 | Endrey |
| 4,742,099 | A | 5/1988 | Nagano et al. |
| 5,166,308 | A | 11/1992 | Kreuz et al. |
| 5,218,034 | A | 6/1993 | Milligan et al. |
| 5,227,244 | A | 7/1993 | Milligan |
| 5,298,331 | A | 3/1994 | Kanakarajan et al. |
| 5,308,569 | A | 5/1994 | Hamamoto et al. |
| 5,543,222 | A | 8/1996 | Edman et al. |
| 6,251,507 | B1 | 6/2001 | Yamamoto et al. |
| 6,379,784 | B1 | 4/2002 | Yamamoto et al. |
| 6,605,366 | B2 | 8/2003 | Yamaguchi et al. |
| 6,808,818 | B2 | 10/2004 | Ozawa et al. |
| 7,285,321 | B2 | 10/2007 | Kanakarajan et al. |
| 2005/0100719 | A1* | 5/2005 | Kanakarajan .......... C09J 179/08 428/209 |
| 2006/0115670 | A1 | 6/2006 | Tanaka et al. |
| 2007/0178323 | A1* | 8/2007 | Yanagida ................. B29C 41/32 428/473.5 |
| 2012/0018197 | A1* | 1/2012 | Park ....................... B32B 15/043 174/254 |
| 2013/0011687 | A1* | 1/2013 | Matsutani ............... C08L 79/08 428/458 |

FOREIGN PATENT DOCUMENTS

EP    0659553 A1    6/1995

OTHER PUBLICATIONS

PCT International Search Report for Application No. PCT/US2018/050583; Ibarrola Torres, O., Authorized Officer; ISA/EPO; Nov. 23, 2018.

* cited by examiner

*Primary Examiner* — Travis M Figg

(57) ABSTRACT

In a first aspect, a multilayer film includes a first outer layer including a first thermoplastic polyimide, a core layer including a polyimide, and a second outer layer including a second thermoplastic polyimide. The polyimide of the core layer includes a first aromatic dianhydride including 3,3',4,4'-biphenyl tetracarboxylic dianhydride and a first aromatic diamine including p-phenylenediamine. The multilayer film has a total thickness in a range of from 5 to 150 μm. A thickness of the core layer is in a range of from 35 to 73% of the total thickness of the multilayer film. A minimum peel strength for at least one of the first and second outer layers, when adhered to copper foil and tested following ASTM method IPC-TM-650, method No. 2.4.9B, is greater than 0.9 kgf/cm (0.88 N/mm). In a second aspect, a metal-clad laminate includes the multilayer film of the first aspect and a first metal layer adhered to an outer surface of the first outer layer of the multilayer film.

19 Claims, No Drawings

MULTILAYER FILM FOR ELECTRONIC CIRCUITRY APPLICATIONS

FIELD OF DISCLOSURE

The field of this disclosure is multilayer films used in electronic circuitry applications.

BACKGROUND OF THE DISCLOSURE

Polyimide films are used in the manufacture of flexible printed circuit boards due to their good electrical insulating properties, mechanical strength, high temperature stability, and chemical resistance properties. Polyimide films are adhered to metal foils to form metal-clad laminates, and find broad usage for die pad bonding of flexible print connection boards, semiconductor devices or packaging materials for chip scale package, chip on flex, chip on lead, lead on chip, multi-chip module, ball grid array (or micro-ball grid array), and/or tape automated bonding, among other applications.

U.S. Pat. No. 7,285,321 describes a multilayer laminate having a low glass transition temperature ($T_g$) polyimide layer, a high $T_g$ polyimide layer, and a conductive layer. The high $T_g$ polyimide layer is a thermoset polyimide and the low $T_g$ polyimide layer is a thermoplastic polyimide. U.S. Pat. No. 6,379,784 describes an aromatic polyimide laminate composed of an aromatic polyimide composite film, a metal film and a release film. The aromatic polyimide composite film is composed of an aromatic polyimide substrate film and two thermoplastic aromatic polyimide layers. The metal film and the release film are adhered to opposite sides of the aromatic polyimide laminate without the use of additional adhesive layers.

Some electronics manufacturing processes require good optical clarity, for instance, when optical registration is used to align various layers in a printed circuit board. In these applications, high transmission and low haze can be critical for circuit designs with extremely fine features. In addition, it is important to maintain optical clarity and good adhesion even during higher temperature curing, which may be used to stabilize materials that will be subjected to higher temperature post-lamination processing. Metal-clad laminates may undergo hot-bar processing or spot welding at temperatures in excess of 300° C. Under these conditions, a low $T_g$ thermoplastic polyimide layer is susceptible to adhesion loss and delamination, distortion and blistering which can be accompanied by a decrease in optical transmission and an increase in haze.

SUMMARY

In a first aspect, a multilayer film includes a first outer layer including a first thermoplastic polyimide, a core layer including a polyimide, and a second outer layer including a second thermoplastic polyimide. The polyimide of the core layer includes a first aromatic dianhydride including 3,3',4,4'-biphenyl tetracarboxylic dianhydride and a first aromatic diamine including p-phenylenediamine. The multilayer film has a total thickness in a range of from 5 to 150 μm. A thickness of the core layer is in a range of from 35 to 73% of the total thickness of the multilayer film. A minimum peel strength for at least one of the first and second outer layers, when adhered to copper foil and tested following ASTM method IPC-TM-650, method No. 2.4.9B, is greater than 0.9 kgf/cm (0.88 N/mm).

In a second aspect, a metal-clad laminate includes the multilayer film of the first aspect and a first metal layer adhered to an outer surface of the first outer layer of the multilayer film.

The foregoing general description and the following detailed description are exemplary and explanatory only and are not restrictive of the invention, as defined in the appended claims.

DETAILED DESCRIPTION

In a first aspect, a multilayer film includes a first outer layer including a first thermoplastic polyimide, a core layer including a polyimide, and a second outer layer including a second thermoplastic polyimide. The polyimide of the core layer includes a first aromatic dianhydride including 3,3',4,4'-biphenyl tetracarboxylic dianhydride and a first aromatic diamine including p-phenylenediamine. The multilayer film has a total thickness in a range of from 5 to 150 μm. A thickness of the core layer is in a range of from 35 to 73% of the total thickness of the multilayer film. A minimum peel strength for at least one of the first and second outer layers, when adhered to copper foil and tested following ASTM method IPC-TM-650, method No. 2.4.9B, is greater than 0.9 kgf/cm (0.88 N/mm).

In one embodiment of the first aspect, the first thermoplastic polyimide includes an aromatic dianhydride selected from the group consisting of 4,4'-oxydiphthalic dianhydride, pyromellitic dianhydride, 3,3',4,4'-biphenyl tetracarboxylic dianhydride, 3,3',4,4'-benzophenone tetracarboxylic dianhydride and mixtures thereof; and an aromatic diamine selected from the group consisting of 1,3-bis(4-aminophenxoxy) benzene, 2,2-bis-(4-[4-aminophenoxy]phenyl) propane and mixtures thereof. In a specific embodiment, the aromatic dianhydride includes pyromellitic dianhydride and 4,4'-oxydiphthalic dianhydride; and the aromatic diamine includes 1,3-bis(4-aminophenoxy) benzene.

In another embodiment of the first aspect, the second thermoplastic polyimide includes an aromatic dianhydride selected from the group consisting of 4,4'-oxydiphthalic dianhydride, pyromellitic dianhydride, 3,3',4,4'-biphenyl tetracarboxylic dianhydride, 3,3',4,4'-benzophenone tetracarboxylic dianhydride and mixtures thereof; and an aromatic diamine selected from the group consisting of 1,3-bis(4-aminophenxoxy) benzene, hexamethylene diamine and mixtures thereof. In a specific embodiment, the aromatic dianhydride includes pyromellitic dianhydride and 4,4'-oxydiphthalic dianhydride; and the aromatic diamine includes 1,3-bis(4-aminophenoxy) benzene.

In yet another embodiment of the first aspect, the first thermoplastic polyimide and second thermoplastic polyimide are the same.

In still another embodiment of the first aspect, the core layer further includes a second aromatic dianhydride. In a specific embodiment, the second aromatic dianhydride is selected from the group consisting of 4,4'-oxydiphthalic dianhydride, pyromellitic dianhydride, 3,3',4,4'-benzophenone tetracarboxylic dianhydride, bisphenol A dianhydride, 1,2,5,6-naphthalene tetracarboxylic dianhydride, 1,4,5,8-naphthalene tetracarboxylic dianhydride, and 2,3,6,7-naphthalene tetracarboxylic dianhydride.

In still yet another embodiment of the first aspect, the core layer further includes a second aromatic diamine. In a specific embodiment, the second aromatic diamine is selected from the group consisting of 4,4'-diaminodiphenyl ether, 3,4'-diaminodiphenyl ether, 2,2'-bis(trifluoromethyl) benzidine, m-phenylenediamine and 4,4'-diaminodiphenylmethane.

In a further embodiment of the first aspect, the core layer further includes both a second aromatic dianhydride and a second aromatic diamine.

In yet a further embodiment of the first aspect, the polyimide of the core layer includes at least 80 mole percent 3,3',4,4'-biphenyl tetracarboxylic dianhydride based on a total dianhydride content of the polyimide and at least 80 mole percent p-phenylenediamine based on a total diamine content of the polyimide.

In still a further embodiment of the first aspect, the multilayer film has a coefficient of thermal expansion of less than 25 μm/(meter-° C.) over a temperature in the range of from 50 to 400° C.

In still yet a further embodiment of the first aspect, the first thermoplastic polyimide and the second thermoplastic polyimide each have a $T_g$ in the range of from 150 to 320° C.

In another embodiment of the first aspect, the multilayer film has a transmission of at least 50% and a haze of less than 30%.

In yet another embodiment of the first aspect, the multilayer film has a total thickness in a range of from 5 to 75 μm.

In still another embodiment of the first aspect, the minimum peel strength of each of the first and second outer layers is greater than 0.9 kgf/cm (0.88 N/mm).

In still yet another embodiment of the first aspect, the thickness of the core layer is in the range of from 55 to 73% of the total thickness of the multilayer film.

In a second aspect, a metal-clad laminate includes the multilayer film of the first aspect and a first metal layer adhered to an outer surface of the first outer layer of the multilayer film.

In one embodiment of the second aspect, the metal-clad laminate further includes a second metal layer adhered to an outer surface of the second outer layer of the multilayer film.

Many aspects and embodiments have been described above and are merely exemplary and not limiting. After reading this specification, skilled artisans appreciate that other aspects and embodiments are possible without departing from the scope of the invention. Other features and advantages of the invention will be apparent from the following detailed description, and from the claims.

In one embodiment, a core layer for a multilayer film includes a polyimide synthesized by a poly-condensation reaction, involving the reaction of a first aromatic dianhydride comprising 3,3',4,4'-biphenyl tetracarboxylic dianhydride with a first aromatic diamine comprising p-phenylenediamine. In one embodiment, the polyimide can include one or more additional aromatic dianhydrides, one or more additional aromatic diamines, or both additional aromatic dianhydrides and additional aromatic diamines. In one embodiment, a second aromatic dianhydride can be selected from the group consisting of 4,4'-oxydiphthalic dianhydride, pyromellitic dianhydride, 3,3',4,4'-benzophenone tetracarboxylic dianhydride, bisphenol A dianhydride, 1,2,5,6-naphthalene tetracarboxylic dianhydride, 1,4,5,8-naphthalene tetracarboxylic dianhydride, and 2,3,6,7-naphthalene tetracarboxylic dianhydride. In one embodiment, a second aromatic diamine can be selected from the group consisting of 4,4'-diaminodiphenyl ether (ODA), 3,4'-diaminodiphenyl ether, 2,2'-bis(trifluoromethyl) benzidine (TFMB), m-phenylenediamine (MPD) and 4,4'-diaminodiphenylmethane (MDA). In one embodiment, the polyimide can include an aliphatic diamine. In one embodiment, the core layer can be a thermoset polyimide. In one embodiment, the core layer can include a polyimide with some thermoplastic properties.

In one embodiment, a first outer layer for a multilayer film includes a first thermoplastic polyimide. In one embodiment, the first thermoplastic polyimide can be synthesized by a poly-condensation reaction, involving the reaction of an aromatic dianhydride and an aromatic diamine. In one embodiment, the first thermoplastic polyimide can include one or more additional aromatic dianhydrides, one or more additional aromatic diamines, or both additional aromatic dianhydrides and additional aromatic diamines. In one embodiment, a second outer layer for a multilayer film includes a second thermoplastic polyimide. In one embodiment, the second thermoplastic polyimide can be synthesized by a poly-condensation reaction, involving the reaction of an aromatic dianhydride and an aromatic diamine. In one embodiment, the second thermoplastic polyimide can include one or more additional aromatic dianhydrides, one or more additional aromatic diamines, or both additional aromatic dianhydrides and additional aromatic diamines. In on embodiment, the first outer layer, the second outer layer, or both the first and the second outer layers can include one or more aliphatic diamines, which may be useful to lower the $T_g$ of the outer layers, if desired. In one embodiment, the first thermoplastic polyimide and the second thermoplastic polyimide can be the same or different.

As used herein, an "aromatic diamine" is intended to mean a diamine having at least one aromatic ring, either alone (i.e., a substituted or unsubstituted, functionalized or unfunctionalized benzene or similar-type aromatic ring) or connected to another (aromatic or aliphatic) ring, and such an amine is to be deemed aromatic, regardless of any non-aromatic moieties that might also be a component of the diamine. Hence, an aromatic diamine backbone chain segment is intended to mean at least one aromatic moiety between two adjacent imide linkages. As used herein, an "aliphatic diamine" is intended to mean any organic diamine that does not meet the definition of an aromatic diamine.

Depending upon context, "diamine" as used herein is intended to mean: (i) the unreacted form (i.e., a diamine monomer); (ii) a partially reacted form (i.e., the portion or portions of an oligomer or other polyimide precursor derived from or otherwise attributable to diamine monomer) or (iii) a fully reacted form (the portion or portions of the polyimide derived from or otherwise attributable to diamine monomer). The diamine can be functionalized with one or more moieties, depending upon the particular embodiment selected in the practice of the present invention.

Indeed, the term "diamine" is not intended to be limiting (or interpreted literally) as to the number of amine moieties in the diamine component. For example, (ii) and (iii) above include polymeric materials that may have two, one, or zero amine moieties. Alternatively, the diamine may be functionalized with additional amine moieties (in addition to the amine moieties at the ends of the monomer that react with dianhydride to propagate a polymeric chain). Such additional amine moieties could be used to crosslink the polymer or to provide other functionality to the polymer.

Similarly, the term "dianhydride" as used herein is intended to mean the component that reacts with (is complimentary to) the diamine and in combination is capable of reacting to form an intermediate polyamic acid (which can then be cured into a polyimide). Depending upon context, "anhydride" as used herein can mean not only an anhydride moiety per se, but also a precursor to an anhydride moiety, such as: (i) a pair of carboxylic acid groups (which can be converted to anhydride by a de-watering or similar-type reaction); or (ii) an acid halide (e.g., chloride) ester functionality (or any other functionality presently known or developed in the future which is) capable of conversion to anhydride functionality.

Depending upon context, "dianhydride" can mean: (i) the unreacted form (i.e. a dianhydride monomer, whether the anhydride functionality is in a true anhydride form or a precursor anhydride form, as discussed in the prior above paragraph); (ii) a partially reacted form (i.e., the portion or portions of an oligomer or other partially reacted or precursor polyimide composition reacted from or otherwise attributable to dianhydride monomer) or (iii) a fully reacted form (the portion or portions of the polyimide derived from or otherwise attributable to dianhydride monomer).

The dianhydride can be functionalized with one or more moieties, depending upon the particular embodiment selected in the practice of the present invention. Indeed, the term "dianhydride" is not intended to be limiting (or interpreted literally) as to the number of anhydride moieties in the dianhydride component. For example, (i), (ii) and (iii) (in the paragraph above) include organic substances that may have two, one, or zero anhydride moieties, depending upon whether the anhydride is in a precursor state or a reacted state. Alternatively, the dianhydride component may be functionalized with additional anhydride type moieties (in addition to the anhydride moieties that react with diamine to provide a polyimide). Such additional anhydride moieties could be used to crosslink the polymer or to provide other functionality to the polymer.

Any one of a number of polyimide manufacturing processes may be used to prepare multilayer films. It would be impossible to discuss or describe all possible polyimide manufacturing processes useful in the practice of the present invention. It should be appreciated that the monomer systems of the present invention are capable of providing the above-described advantageous properties in a variety of manufacturing processes. The compositions of the present invention can be manufactured as described herein and can be readily manufactured in any one of many (perhaps countless) ways by those of ordinarily skilled in the art, using any conventional or non-conventional polyimide (and multilayer) manufacturing technology.

Although methods and materials similar or equivalent to those described herein can be used in the practice or testing of the present invention, suitable methods and materials are described herein.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

In describing certain polymers, it should be understood that sometimes applicants are referring to the polymers by the monomers used to make them or the amounts of the monomers used to make them. While such a description may not include the specific nomenclature used to describe the final polymer or may not contain product-by-process terminology, any such reference to monomers and amounts should be interpreted to mean that the polymer is made from those monomers or that amount of the monomers, and the corresponding polymers and compositions thereof.

The materials, methods, and examples herein are illustrative only and, except as specifically stated, are not intended to be limiting.

As used herein, the terms "comprises," "comprising," "includes," "including," "has," "having" or any other variation thereof, are intended to cover a non-exclusive inclusion. For example, a method, process, article, or apparatus that comprises a list of elements is not necessarily limited only those elements but may include other elements not expressly listed or inherent to such method, process, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Organic Solvents

Useful organic solvents for the synthesis of the polyimides of the present invention are preferably capable of dissolving the polyimide precursor materials. Such a solvent should also have a relatively low boiling point, such as below 225° C., so the polymer can be dried at moderate (i.e., more convenient and less costly) temperatures. A boiling point of less than 210, 205, 200, 195, 190, or 180° C. is preferred.

Solvents of the present invention may be used alone or in combination with other solvents (i.e., co-solvents). Useful organic solvents include: N-methylpyrrolidone (NMP), dimethylacetamide (DMAc), N,N'-dimethyl-formamide (DMF), dimethyl sulfoxide (DMSO), tetramethyl urea (TMU), diethyleneglycol diethyl ether, 1,2-dimethoxyethane (monoglyme), diethylene glycol dimethyl ether (diglyme), 1,2-bis-(2-methoxyethoxy) ethane (triglyme), bis [2-(2-methoxyethoxy) ethyl)] ether (tetraglyme), gamma-butyrolactone, and bis-(2-methoxyethyl) ether, tetrahydrofuran. In one embodiment, preferred solvents include N-methylpyrrolidone (NMP) and dimethylacetamide (DMAc).

Co-solvents can generally be used at about 5 to 50 weight percent of the total solvent, and useful such co-solvents include xylene, toluene, benzene, "Cellosolve" (glycol ethyl ether), and "Cellosolve acetate" (hydroxyethyl acetate glycol monoacetate).

Aromatic Diamines

While the core layer includes p-phenylenediamine (PPD) as a first aromatic diamine, in one embodiment, any number of suitable aromatic diamines can also be included in the core layer polyimide, including m-phenylenediamine (MPD), 2,5-dimethyl-1,4-diaminobenzene, trifluoromethyl-2,4-diaminobenzene, trifluoromethyl-3,5-diaminobenzene, 2,5-dimethyl-1,4-phenylenediamine (DPX), 2,2-bis-(4-aminophenyl) propane, 4,4'-diaminobiphenyl, 4,4'-diaminobenzophenone, 4,4'-diaminodiphenylmethane (MDA), 4,4'-diaminodiphenyl sulfide, 4,4'-diaminodiphenyl sulfone, 3,3'-diaminodiphenyl sulfone, bis-(4-(4-aminophenoxy)phenyl sulfone (BAPS), 4,4'-bis-(aminophenoxy)biphenyl (BAPB), 4,4'-diaminodiphenyl ether (ODA), 3,4'-diaminodiphenyl ether, 4,4'-diaminobenzophenone, 4,4'-isopropylidenedianiline, 2,2'-bis-(3-aminophenyl)propane, N,N-bis-(4-aminophenyl)-n-butylamine, N,N-bis-(4-aminophenyl) methylamine, 1,5-diaminonaphthalene, 3,3'-dimethyl-4,4'-diaminobiphenyl, m-aminobenzoyl-p-amino anilide, 4-aminophenyl-3-aminobenzoate, N,N-bis-(4-aminophenyl) aniline, 2,4-diaminotoluene, 2,5-diaminotoluene, 2,6-diaminotoluene, 2,4-diamine-5-chlorotoluene, 2,4-diamine-6-chlorotoluene, 2,4-bis-(beta-amino-t-butyl) toluene, bis-(p-beta-amino-t-butyl phenyl) ether, p-bis-2-(2-methyl-4-aminopentyl) benzene, m-xylylene diamine, and p-xylylene diamine.

Other useful aromatic diamines include 2,2'-bis(trifluoromethyl) benzidine (TFMB), 1,2-bis-(4-aminophenoxy) benzene, 1,3-bis-(4-aminophenoxy) benzene, 1,2-bis-(3-aminophenoxy)benzene, 1,3-bis-(3-aminophenoxy) benzene, 1-(4-aminophenoxy)-3-(3-aminophenoxy) benzene, 1,4-bis-(4-aminophenoxy) benzene, 1,4-bis-(3-aminophenoxy) benzene, 1-(4-aminophenoxy)-4-(3-aminophenoxy) benzene, 2,2-bis-(4-[4-aminophenoxy]phenyl) propane (BAPP), 2,2'-bis-(4-aminophenyl)-hexafluoro propane (6F diamine), 2,2'-bis-(4-phenoxy aniline) isopropylidene, 2,4,6-trimethyl-1,3-diaminobenzene, 4,4'-diamino-2,2'-trifluoromethyl diphenyloxide, 3,3'-diamino-5,5'-trifluoromethyl diphenyloxide, 4,4'-trifluoromethyl-2,2'-diaminobiphenyl, 2,4,6-trimethyl-1,3-diaminobenzene, 4,4'-oxy-bis-[2-trifluoromethyl)benzene amine] (1,2,4-OBABTF), 4,4'-oxy-bis-[3-trifluoromethyl)benzene amine], 4,4'-thio-bis-[(2-trifluoromethyl)benzene-amine], 4,4'-thio-bis[(3-trifluoromethyl)benzene amine], 4,4'-sulfoxyl-bis-[(2-trifluoromethyl)benzene amine], 4,4'-sulfoxyl-bis-[(3-trifluoromethyl)benzene amine], and 4,4'-keto-bis-[(2-trifluoromethyl)benzene amine].

In one embodiment, useful aromatic diamines include the isomers of bis-aminophenoxybenzenes (APB), aminophenoxyphenylpropane (BAPP), dimethylphenylenediamine (DPX), bisaniline P, and combinations thereof, and the use of these particular aromatic diamines can lower the lamination temperature of the polyimide, and can increase the peel strength of the polyimide when adhered to other materials, especially metals.

In one embodiment, the thermoplastic polyimide of the outer layers can include one or more of any of the aromatic diamines listed above for the core layer, including p-phenylenediamine.

Aromatic Dianhydrides

While the core layer includes 3,3',4,4'-biphenyl tetracarboxylic dianhydride (BPDA) as a first aromatic dianhydride, in one embodiment, any aromatic dianhydride or combination of aromatic dianhydrides, can be used as additional dianhydride monomers in forming the core layer polyimide. The dianhydrides can be used in their tetra-acid form (or as mono, di, tri, or tetra esters of the tetra acid), or as their diester acid halides (chlorides). However, in some embodiments, the dianhydride form can be preferred, because it is generally more reactive than the acid or the ester.

Examples of suitable aromatic dianhydrides include, 1,2,5,6-naphthalene tetracarboxylic dianhydride, 1,4,5,8-naphthalene tetracarboxylic dianhydride, 2,3,6,7-naphthalene tetracarboxylic dianhydride, 2-(3',4'-dicarboxyphenyl) 5,6-dicarboxybenzimidazole dianhydride, 2-(3',4'-dicarboxyphenyl) 5,6-dicarboxybenzoxazole dianhydride, 2-(3',4'-dicarboxyphenyl) 5,6-dicarboxybenzothiazole dianhydride, 2,2',3,3'-benzophenone tetracarboxylic dianhydride, 2,3,3',4'-benzophenone tetracarboxylic dianhydride, 3,3',4,4'-benzophenone tetracarboxylic dianhydride (BTDA), 2,2',3,3'-biphenyl tetracarboxylic dianhydride, 3',4'-biphenyl tetracarboxylic dianhydride, bicyclo-[2,2,2]-octen-(7)-2,3,5,6-tetracarboxylic-2,3,5,6-dianhydride, 4,4'-thio-diphthalic anhydride, bis (3,4-dicarboxyphenyl) sulfone dianhydride, bis (3,4-dicarboxyphenyl) sulfoxide dianhydride (DSDA), bis (3,4-dicarboxyphenyl oxadiazole-1,3,4) p-phenylene dianhydride, bis (3,4-dicarboxyphenyl) 2,5-oxadiazole 1,3,4-dianhydride, bis 2,5-(3',4'-dicarboxydiphenylether) 1,3,4-oxadiazole dianhydride, 4,4'-oxydiphthalic anhydride (ODPA), bis (3,4-dicarboxyphenyl) thio ether dianhydride, bisphenol A dianhydride (BPADA), bisphenol S dianhydride, 2,2-bis-(3,4-dicarboxyphenyl) 1,1,1,3,3,3,-hexafluoropropane dianhydride (6FDA), 5,5-[2,2,2]-trifluoro-1-(trifluoromethyl)ethylidene, bis-1,3-isobenzofurandione, 1,4-bis(4,4'-oxyphthalic anhydride) benzene, bis (3,4-dicarboxyphenyl) methane dianhydride, cyclopentadienyl tetracarboxylic acid dianhydride, cyclopentane tetracarboxylic dianhydride, ethylene tetracarboxylic acid dianhydride, perylene 3,4,9,10-tetracarboxylic dianhydride, pyromellitic dianhydride (PMDA), tetrahydrofuran tetracarboxylic dianhydride, 1,3-bis-(4,4'-oxydiphthalic anhydride) benzene, 2,2-bis(3,4-dicarboxyphenyl) propane dianhydride, 2,6-dichloronaphthalene-1,4,5,8-tetracarboxylic dianhydride, 2,7-dichloronaphthalene-1,4,5,8-tetracarboxylic dianhydride, 2,3,6,7-tetrachloronaphthalene-1,4,5,8-tetracarboxylic dianhydride, phenanthrene-1,8,9,10-tetracarboxylic dianhydride, pyrazine-2,3,5,6-tetracarboxylic dianhydride, benzene-1,2,3,4-tetracarboxylic dianhydride; and thiophene-2,3,4,5-tetracarboxylic dianhydride.

In one embodiment, the thermoplastic polyimide of the outer layers can include one or more of any of the aromatic dianhydrides listed above for the core layer, including 3,3',4,4'-biphenyl tetracarboxylic dianhydride.

Multilayer Films

Polyimide film layers according to the present invention can be produced by combining the diamine and dianhydride (monomer or other polyimide precursor form) together with a solvent to form a polyamic acid (also called a polyamide acid) solution. The dianhydride and diamine can be combined in a molar ratio of about 0.90 to 1.10. The molecular weight of the polyamic acid formed therefrom can be adjusted by adjusting the molar ratio of the dianhydride and diamine.

In one embodiment, a polyamic acid casting solution is derived from the polyamic acid solution. The polyamic acid casting solution preferably comprises the polyamic acid solution can optionally be combined with conversion chemicals like: i.) one or more dehydrating agents, such as, aliphatic acid anhydrides (acetic anhydride, etc.) and/or aromatic acid anhydrides; and ii.) one or more catalysts, such as, aliphatic tertiary amines (triethyl amine, etc.), aromatic tertiary amines (dimethyl aniline, etc.) and heterocyclic tertiary amines (pyridine, picoline, isoquinoline, etc.). The anhydride dehydrating material it is often used in molar excess compared to the amount of amide acid groups in the polyamic acid. The amount of acetic anhydride used is typically about 2.0-4.0 moles per equivalent (repeat unit) of polyamic acid. Generally, a comparable amount of tertiary amine catalyst is used.

In one embodiment, the polyamic acid solution, and/or the polyamic acid casting solution, is dissolved in an organic solvent at a concentration from about 5.0 or 10% to about 15, 20, 25, 30, 35 and 40% by weight.

The polyamic acid (and casting solution) can further comprise any one of a number of additives, such as processing aids (e.g., oligomers), antioxidants, light stabilizers, flame retardant additives, anti-static agents, heat stabilizers, ultraviolet absorbing agents, inorganic fillers or various reinforcing agents. These inorganic fillers include thermally conductive fillers, like metal oxides, inorganic nitrides and metal carbides, and electrically conductive fillers like metals, graphitic carbon and carbon fibers, and electrically conductive polymers. Common inorganic fillers are alumina, silica, silicon carbide, diamond, clay, boron nitride, aluminum nitride, titanium dioxide, dicalcium phosphate, and fumed metal oxides. Common organic fillers include polyaniline, polythiophene, polypyrrole, polyphenylenevinylene, polydialkylfluorenes, carbon black, graphite, multi-walled and single walled carbon nanotubes and carbon nanofibers.

The solvated mixture (the polyamic acid casting solution) can then be cast or applied onto a support, such as an endless belt or rotating drum, to give a film. Next, the solvent containing-film can be converted into a self-supporting film by heating at an appropriate temperature (thermal curing) together with conversion chemical reactants (chemical curing). The film can then be separated from the support, oriented such as by tentering, with continued thermal and chemical curing to provide a polyimide film.

Useful methods for producing polyimide film in accordance with the present invention can be found in U.S. Pat. Nos. 5,166,308 and 5,298,331, which are incorporate by reference into this specification for all teachings therein. Numerous variations are also possible, such as, (a.) A method wherein the diamine components and dianhydride components are preliminarily mixed together and then the mixture is added in portions to a solvent while stirring.

(b.) A method wherein a solvent is added to a stirring mixture of diamine and dianhydride components. (contrary to (a) above)

(c.) A method wherein diamines are exclusively dissolved in a solvent and then dianhydrides are added thereto at such a ratio as allowing to control the reaction rate.

(d.) A method wherein the dianhydride components are exclusively dissolved in a solvent and then amine components are added thereto at such a ratio to allow control of the reaction rate.

(e.) A method wherein the diamine components and the dianhydride components are separately dissolved in solvents and then these solutions are mixed in a reactor.

(f.) A method wherein the polyamic acid with excessive amine component and another polyamic acid with excessive dianhydride component are preliminarily formed and then reacted with each other in a reactor, particularly in such a way as to create a non-random or block copolymer.

(g.) A method wherein a specific portion of the amine components and the dianhydride components are first reacted and then the residual diamine components are reacted, or vice versa.

(h.) A method wherein the conversion chemicals are mixed with the polyamic acid to form a polyamic acid casting solution and then cast to form a gel film.

(i.) A method wherein the components are added in part or in whole in any order to either part or whole of the solvent, also where part or all of any component can be added as a solution in part or all of the solvent.

(j.) A method of first reacting one of the dianhydride components with one of the diamine components giving a first polyamic acid. Then reacting the other dianhydride component with the other amine component to give a second polyamic acid. Then combining the amic acids in any one of a number of ways prior to film formation.

The thickness of each polyimide layer may be adjusted, depending on the intended purpose of the film or final application specifications. In one embodiment, the multilayer film has a total thickness of from about 5 to about 150 µm. In one embodiment, the multilayer film has a total thickness of from about 5 to about 75 µm. In one embodiment, the thickness of the core layer is in a range of from about 35 to about 73% of the total thickness of the multilayer film. For example, a multilayer film might have an overall thickness of 30 µm, with a 22 µm core layer and 4 µm first and second outer layers on either side of the core layer. In another example, for a thicker film, a multilayer film might have an overall thickness of 50 µm, with a 34 µm core layer and 7 µm first and second outer layers on either side of the core layer. In still another example, for a very thin film, a multilayer film might have an overall thickness of 5 µm, with a 2 µm core layer and 1.5 µm first and second outer layers on either side of the core layer. In one embodiment, the thickness of the core layer is in a range of from about 55 to about 73% of the total thickness of the multilayer film. Those skilled in the art will appreciate that a minimum thickness of the outer layers with thermoplastic polyimide is needed to provide sufficient adhesion to metal layers to form a useful metal-clad laminate for electronic circuitry applications. In addition, a minimum thickness of the core layer is needed to maintain the mechanical integrity of the multilayer film.

In one embodiment, the first thermoplastic polyimide and the second thermoplastic polyimide of the multilayer film both have a $T_g$ in the range of from about 150 to about 320° C. In a specific embodiment, the first thermoplastic polyimide and the second thermoplastic polyimide of the multilayer film both have a $T_g$ in the range of from about 230 to about 320° C. In a more specific embodiment, the first thermoplastic polyimide and the second thermoplastic polyimide of the multilayer film both have a $T_g$ in the range of from about 270 to about 320° C. Having thermoplastic polyimides in the outer layers with a higher $T_g$ improves the thermal durability of the multilayer film. Metal-clad laminates may undergo post-lamination processes such as hotbar processing or spot welding at temperatures in excess of 300° C. Under these conditions, a low $T_g$ thermoplastic polyimide layer is susceptible to adhesion loss and delamination, distortion and blistering which can be accompanied by a decrease in optical transmission and an increase in haze. Maintaining good optical clarity can be extremely important for some electronics manufacturing processes, for instance, when optical registration is used to align various layers in a printed circuit board. In these applications, high transmission and low haze can be critical for circuit designs with extremely fine features. It is important to maintain optical clarity even during higher temperature curing, which may be used to stabilize materials that will be subjected to these higher temperature post-lamination processes. In one embodiment, the multilayer film has a transmission of at least 50% and a haze of less than 30%.

In one embodiment, the core layer and the outer layers can be simultaneously solution cast by co-extrusion. At the time of casting, the polyimides can be in the form of a polyamic acid solution. The cast solutions form an uncured polyamic acid film that is later cured to a polyimide. The adhesion strength of such laminates can be improved by employing various techniques for elevating adhesion strength.

In some embodiments, a finished polyamic acid solution is filtered and pumped to a slot die, where the flow is divided in such a manner as to form the first outer layer and the second outer layer of a three-layer coextruded film. In some embodiments, a second stream of polyimide is filtered, then pumped to a casting die, in such a manner as to form the middle polyimide core layer of a three-layer coextruded film. The flow rates of the solutions can be adjusted to achieve the desired layer thickness.

In some embodiments, the multilayer film is prepared by simultaneously extruding the first outer layer, the core layer and the second outer layer. In some embodiments, the layers are extruded through a single or multi-cavity extrusion die. In another embodiment, the multilayer film is produced using a single-cavity die. If a single-cavity die is used, the laminar flow of the streams should be of high enough viscosity to prevent comingling of the streams and to provide even layering. In some embodiments, the multilayer film is prepared by casting from the slot die onto a moving stainless-steel belt. In one embodiment, the belt is then passed through a convective oven, to evaporate solvent and partially imidize the polymer, to produce a "green" film. The green film can be stripped off the casting belt and wound up. The green film can then be passed through a tenter oven to produce a fully cured polyimide film. In some embodiments, during tentering, shrinkage can be minimized by constraining the film along the edges (i.e., using clips or pins).

In one embodiment, the outer layers of the present invention can also be applied to the core layer during an intermediate manufacturing stage of making polyimide film such as to gel film or to green film.

The term "gel film" refers to a polyamic acid sheet, which is laden with volatiles, primarily solvent, to such an extent that the polyamic acid is in a gel-swollen, or rubbery condition, and may be formed in a chemical conversion process. The volatile content is usually in the range of 70 to 90% by weight and the polymer content usually in the range of 10 to 30% by weight of the gel film. The final film becomes "self-supporting" in the gel film stage. It can be stripped from the support on which it was cast and heated to a final curing temperature. The gel film generally has an amic acid to imide ratio between 10:90 and 50:50, most often 30:70.

The gel film structure can be prepared by the method described in U.S. Pat. No. 3,410,826. This patent discloses mixing a chemical converting agent and a catalyst, such as a lower fatty acid anhydride and a tertiary amine, into the polyamic-acid solution at a low temperature. This is followed by casting the polyamic-acid solution in film-form, onto a casting drum. The film is mildly heated after casting, at for example 100° C., to activate the conversion agent and catalyst in order to transform the cast film to a polyamic acid/polyimide gel film.

Another type of polyimide base film, is a "green film" which is partially polyamic acid and partially polyimide, and may be formed in a thermal conversion process. Green film contains generally about 50 to 75% by weight polymer and 25 to 50% by weight solvent. Generally, it should be sufficiently strong to be substantially self-supporting. Green film can be prepared by casting the polyamic acid solution into film form onto a suitable support such as a casting drum or belt and removing the solvent by mild heating at up to 150° C. A low proportion of amic acid units in the polymer, e.g., up to 25%, may be converted to imide units.

Application of the polyimide films of the present invention can be accomplished in any number of ways. Such methods include using a slot die, dip coating, or kiss-roll coating a film followed by metering with doctor knife, doctor rolls, squeeze rolls, or an air knife. The coating may also be applied by brushing or spraying. By using such techniques, it is possible to prepare both one and two-sided coated laminates. In preparation of the two-side coated structures, one can apply the coatings to the two sides of a polyimide either simultaneously or consecutively before going to the curing and drying stage of the polyimide.

In one embodiment, the multilayer film has a coefficient of thermal expansion (CTE) of less than 25 µm/(meter-° C.) over a temperature in the range of from about 50 to about 400° C. Keeping a low CTE over a broad temperature enables the multilayer film to maintain good adhesion even during higher temperature curing, which may be used to stabilize materials that will be subjected to higher temperature post-lamination processing. Metal-clad laminates may undergo hot-bar processing or spot welding at temperatures in excess of 300° C. Under these conditions, a multilayer film with a CTE of greater than 25 µm/(meter-° C.) over a temperature in the range of from about 50 to about 400° C. is susceptible to adhesion loss and delamination, distortion and blistering.

Metal-Clad Laminates

In one embodiment, a conductive layer of the present invention can be created by:
  i. metal sputtering (optionally, then electroplating);
  ii. foil lamination; and/or
  iii. any conventional or non-conventional method for applying a thin metallic layer to a substrate.

In one embodiment, a lamination process may be used to form a metal-clad laminate with a multilayer film. In one embodiment, a first outer layer including a first thermoplastic polyimide is placed between a first conductive layer and a core layer, and a second outer layer including a second thermoplastic polyimide is placed on the opposite side of the core layer. In one embodiment, a second conductive layer is placed in contact with the second outer layer on a side opposite the core layer. One advantage of this type of construction is that the lamination temperature of the multilayer film is lowered to the lamination temperature necessary for the thermoplastic polyimide of the outer layer to bond to a conductive layer(s). In one embodiment, the conductive layer(s) is a metal layer(s).

For example, prior to the step of applying the multilayer film of the present invention onto a metal foil, the polyimide film can be subjected to a pre-treatment step. Pre-treatment steps can include, heat treatment, corona treatment, plasma treatment under atmospheric pressure, plasma treatment under reduced pressure, treatment with coupling agents like silanes and titanates, sandblasting, alkali-treatment, acid-treatments, and coating polyamic acids. To improve the adhesion strength, it is generally also possible to add various metal compounds as disclosed in U.S. Pat. Nos. 4,742,099; 5,227,244; 5,218,034; and 5,543,222, incorporated herein by reference.

In addition, (for purposes of improving adhesion) the conductive metal surface may be treated with various organic and inorganic treatments. These treatments include using silanes, imidazoles, triazoles, oxide and reduced oxide treatments, tin oxide treatment, and surface cleaning/roughening (called micro-etching) via acid or alkaline reagents.

In a further embodiment, the polyamic acid precursor (to a polyimide film of the present invention) may be coated on a fully cured polyimide base film or directly on a metal substrate and subsequently imidized by heat treatment. The polyimide base film may be prepared by either a chemical or thermal conversion process and may be surface treated, e.g. by chemical etching, corona treatment, laser etching etc., to improve adhesion.

As used herein, the term "conductive layers" and "conductive foils" mean metal layers or metal foils (thin compositions having at least 50% of the electrical conductivity of a high-grade copper). Conductive foils are typically metal foils. Metal foils do not have to be used as elements in pure form; they may also be used as metal foil alloys, such as copper alloys containing nickel, chromium, iron, and other metals. The conductive layers may also be alloys of metals and are typically applied to the polyimides of the present invention via a sputtering step followed by an electro-plating step. In these types of processes, a metal seed coat layer is first sputtered onto a polyimide film. Finally, a thicker coating of metal is applied to the seed coat via electro-plating or electro-deposition. Such sputtered metal layers may also be hot pressed above the glass transition temperature of the polymer for enhanced peel strength.

Particularly suitable metallic substrates are foils of rolled, annealed copper or rolled, annealed copper alloy. In many cases, it has proved to be advantageous to pre-treat the metallic substrate before coating. This pre-treatment may include, but is not limited to, electro-deposition or immersion-deposition on the metal of a thin layer of copper, zinc, chrome, tin, nickel, cobalt, other metals, and alloys of these metals. The pre-treatment may consist of a chemical treatment or a mechanical roughening treatment. It has been found that this pre-treatment enables the adhesion of the polyimide layer and, hence, the peel strength to be further increased. Apart from roughening the surface, the chemical pre-treatment may also lead to the formation of metal oxide groups, enabling the adhesion of the metal to a polyimide layer to be further increased. This pre-treatment may be applied to both sides of the metal, enabling enhanced adhesion to substrates on both sides. In one embodiment, a multilayer film, when adhered to a copper foil and tested following ASTM method IPC-TM-650, method No. 2.4.9B, has a minimum peel strength of greater than 0.9 kgf/cm (0.88 N/mm) for at least one of the first and second outer layers. In a specific embodiment, the multilayer film has a minimum peel strength of greater than 0.9 kgf/cm (0.88 N/mm) for each of the first and second outer layers.

In one embodiment, a metal-clad laminate can include the multilayer film and a first metal layer adhered to an outer surface of the first outer layer of the multilayer film. In one embodiment, a metal-clad laminate can include a second metal layer adhered to an outer surface of the second outer layer of the multilayer film. In one embodiment, the first metal layer, the second metal layer or both metal layers can be copper. In one embodiment, a metal-clad laminate of the present invention comprising a double side copper-clad can be prepared by laminating copper foil to both sides of the multilayer film.

In addition, the polyimide films of the present invention generally also have a low loss-tangent value. Loss-tangent is typically measured at 10 GHz and is used to measure a dielectric material's degradation of a nearby digital signal that is passing through a metal circuit trace. Different loss-tangent values exist for different dielectric materials. The lower the loss-tangent value for a given dielectric material, the (increasingly) superior a material is for digital circuitry applications. The polyimides of the present invention exhibit excellent, low loss-tangent values. In one embodiment, the loss-tangent value for the polyimide layers was less than 0.010, about 0.004, at 10 GHz. The polyimides of present invention may also be used in applications ranging from 1 to 100 GHz, with 1 to 20 GHz being most common.

In another embodiment, the multilayer films of the present invention are used as a material to construct a planar transformer component. These planar transformer components are commonly used in power supply devices.

In yet another embodiment, the polyimide films of the present invention may be used with thick metal foils to form flexible heaters. These heaters are typically used in automotive and aerospace applications.

The multilayer films of the present invention exhibit excellent attenuation. The polyimides of the present invention can often exhibit an attenuation value, measured in decibels per inch, of about 0.3 at 10 GHz using a 50-ohm micro strip.

In one embodiment, a polyimide precursor for a core layer and polyimide precursors for first and second outer layers are cast simultaneously (using a multi-port die) to form a multilayer polyimide film (after curing of the polyamic acid layers). This multilayer film is then bonded to metal layer(s) using the thermoplastic polyimide of the outer layer(s) as the bonding layer to the metal layer(s). Thus, a multilayer film metal-clad laminate formed comprises the multilayer film and at least one conductive layer. Bonding of the multilayer polyimide/metal-clad laminates, when a metal foil is used as the conductive layer, can take place in a double belt press in roll to roll processing, or in an autoclave in sheet to sheet processing.

The polyimides of the present invention are particularly useful for die pad bonding of flexible print connection boards or semiconductor devices or packaging materials for CSP (chip scale package), chip on flex (COF), COL (chip on lead), LOC (lead on chip), multi-chip module ("MCM"), ball grid array ("BGA" or micro-ball grid array), and/or tape automated bonding ("TAB").

In another embodiment, the multilayer films of the present invention are used for wafer level integrated circuit packaging, where a composite is made using a multilayer film according to the present invention interposed between a conductive layer (typically a metal) having a thickness of less than 100 µm, and a wafer comprising a plurality of integrated circuit dies. In one (wafer level integrated circuit packaging) embodiment, the conductive passageway is connected to the dies by a conductive passageway, such as a wire bond, a conductive metal, a solder bump or the like.

The advantageous properties of this invention can be observed by reference to the following examples that illustrate, but do not limit, the invention. All parts and percentages are by weight unless otherwise indicated.

Test Methods

Peel Strength

To measure peel strength, roll clad laminates were made by continuous lamination to copper foil using a high temperature nip roll laminator heated to 350° C. The adhesion or "peel strength" results of the multilayer films laminated to copper were determined by ASTM method IPC-TM-650, Method No. 2.4.9B, and were measured on both sides of the multilayer film.

Transparency

Transparency was measured using a Haze-Guard Plus (BYK-Gardner GmbH, Germany). The total transmittance (normal and diffuse transmitted light) was recorded over a wavelength range of 400-700 nm and is reported as percent transmission.

Haze

Haze was also measured using the Haze-Guard Plus, with the haze measured in transmission by collecting forward scattered light using the method described by ASTM1003.

Percent haze was determined by measuring the amount of light which deviates from the incident beam by more than 2.5 degrees on average.

EXAMPLES

Polyamic acid solutions for producing the core layer and outer layers were separately prepared by a chemical reaction between the appropriate molar equivalents of the monomers in dimethylacetamide (DMAc) solvent. Typically, the diamine dissolved in DMAc was stirred under nitrogen, and the dianhydride was added as a solid over a period of several minutes. Stirring was continued to obtain maximum viscosity of the polyamic acid. The viscosity was adjusted by controlling the amount of dianhydride in the polyamic acid composition.

Multilayer films were cast by co-extrusion. Three separate polyamic polymer streams were simultaneously extruded through a multi-cavity extrusion die onto a heated moving belt to form a co-extruded three-layer polyimide film. The thicknesses of the polyimide core layer and the top and bottom thermoplastic polyimide outer layers were adjusted by varying the amounts of polyamic acids fed to the extruder.

The extruded multilayer film was dried at an oven temperature in the range of from about 95 to about 150° C. The self-supporting film was peeled from the belt and heated with radiant heaters in a tenter oven at a temperature of from about 110 to about 805° C. (radiant heater surface temperature) to completely dry and imidize the polymers.

Example 1

For Example 1 (E1), the radiant heating set point temperature used to cure the film was 805° C. The core layer polymer composition contained a polyimide derived from an approximately 1:1 molar ratio of dianhydride to diamine. The dianhydride composition contained the monomers BPDA/PMDA in a 95:5 molar ratio and the diamine composition contained the monomers PPD/ODA in a 92:8 molar ratio.

The thermoplastic outer layers also contained a polyimide derived from an approximately 1:1 molar ratio of dianhydride to diamine. The dianhydride composition contained the monomers PMDA and ODPA in a 20:80 molar ratio and the diamine composition was 100 mole % RODA monomer. The flow rates of the polyamic acid solutions were adjusted to yield a three-layer film in which the thermoplastic outer layers were approximately 8.1 and 7.1 μm thick, respectively.

A cross sectional scanning electron microscope (SEM) image of the three-layer film was obtained to determine the thicknesses of the multilayer film and the individual core and outer layers. To obtain this image, a film sample was cut and mounted in an epoxy and allowed to dry overnight. The sample was then polished using a Buehler variable speed grinder/polisher and placed into a desiccator for about two hours to ensure dryness. The image was captured using a Hitachi S-3400 SEM (Hitachi High Technologies America, Inc., Schaumburg, Ill.) under variable pressure. The total thickness of the multilayer film was 48.1 μm. The core layer thickness as a percentage of the total multilayer film thickness was 68.4%. Two samples were prepared to measure the transmission, 62.4% and 63.4%, and haze, 22.1% and 23.3%, of the multilayer film.

A portion of the multilayer film was used to prepare a copper-clad laminate for measuring peel strength. Cu foil was laminated to both sides of the multilayer film. Roll clads were made by continuous lamination of the adhesive coated dielectric film to copper foil using a high temperature nip roll laminator with one surface heated to 350° C. Adhesion, or peel strength, of the polyimide copper-clad laminates was measured following ASTM method IPC-TM-650, Method No. 2.4.9B, with resulting peel strengths of 1.0 kgf/cm (0.98 N/mm) and 1.13 kgf/cm (1.1 N/mm).

Physical properties are summarized in Table 1.

Comparative Example 1

For Comparative Example 1 (CE1), a film was co-extruded to form a three-layer film using a process similar to that of E1. The compositions of the core layer and the outer layers were the same as in E1. The flow rates of the polyamic acid solutions were adjusted to yield a three-layer architecture in which the two outer layers were approximately 6.6 and 6.1 μm thick, respectively.

The total thickness of the multilayer film was 48.7 μm, and the core layer thickness as a percentage of the total multilayer film thickness was 73.9%. The transmission of CE1, 46.1%, was significantly lower than that of E1, while the haze, 35.2%, was noticeably higher.

Example 2

For Example 2 (E2), a film was co-extruded to form a three-layer film using a process similar to that of E1. The compositions of the core layer and the outer layers were the same as in E1. The flow rates of the polyamic acid solutions were adjusted to yield a three-layer architecture in which the two outer layers were each approximately 1.8 μm thick.

The total thickness of the multilayer film was 12.4 μm. The core layer thickness as a percentage of the total multilayer film thickness was 71.1%. The transmission, 87.2%, haze, 1.48%, and peel strengths, 0.91 kgf/cm (0.89 N/mm) and 0.96 kgf/cm (0.94 N/mm), were all very good.

Comparative Example 2

For Comparative Example 2 (CE2), a film was co-extruded to form a three-layer film using a process similar to that of E1. The compositions of the core layer and the outer layers were the same as in E1. The flow rates of the polyamic acid solutions were adjusted to yield a three-layer architecture in which the two outer layers were approximately 3.0 and 4.6 μm thick, respectively.

The total thickness of the multilayer film was 31.4 μm. The core layer thickness as a percentage of the total multilayer film thickness was 76.0%. While the transmission, 87.2%, and haze, 1.48%, of CE2 were very good, the peel strengths, 0.85 kgf/cm (0.83 N/mm) and 0.87 kgf/cm (0.85 N/mm), were lower than desired.

Comparative Example 3

For Comparative Example 3 (CE3), a film was co-extruded to form a three-layer film using a process similar to that of E1. The core layer polymer composition contained a polyimide derived from a 1:1 molar ratio of dianhydride (BPDA) and diamine (PPD). The compositions of the outer layers were the same as in E1. The flow rates of the polyamic acid solutions were adjusted to yield a three-layer architecture in which the two outer layers were approximately 4.6 and 5.8 μm thick, respectively.

The total thickness of the multilayer film was 54.9 μm. The core layer thickness as a percentage of the total multilayer film thickness was 81.1%. The transmission, 66.9%, and haze, 5.2%, of CE3 were both good, but the peel strengths of CE3, 0.82 kgf/cm (0.80 N/mm) and 0.85 kgf/cm (0.83 N/mm) were noticeably lower than for E1.

TABLE 1

| | OL1 (μm) | CL (μm) | OL2 (μm) | CL/total (%) | Peel Strength (kgf/cm) | Transmission (%) | Haze (%) |
|---|---|---|---|---|---|---|---|
| E1 | 8.08 | 32.89 | 7.09 | 68.4 | 1.0, 1.13 | 62.4, 63.4 | 22.1, 23.3 |
| CE1 | 6.60 | 36.00 | 6.10 | 73.9 | — | 46.1 | 35.2 |
| E2 | 1.82 | 8.81 | 1.76 | 71.1 | 0.91, 0.96 | 87.2 | 1.48 |
| CE2 | 2.98 | 23.82 | 4.56 | 76.0 | 0.85, 0.87 | 80.1 | 2.85 |
| CE3 | 4.57 | 44.49 | 5.83 | 81.1 | 0.82, 0.85 | 66.9 | 5.2 |

Note that not all of the activities described above in the general description are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. All features disclosed in this specification may be replaced by alternative features serving the same, equivalent or similar purpose.

Accordingly, the specification and figures are to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

When an amount, concentration, or other value or parameter is given as either a range, preferred range or a list of upper values and lower values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. It is not intended that the scope of the invention be limited to the specific values recited when defining a range.

What is claimed is:

1. A multilayer film comprising:
a first outer layer comprising a first thermoplastic polyimide consisting of a polyimide composition derived from:
an aromatic dianhydride; and
an aromatic diamine selected from the group consisting of m-phenylenediamine, trifluoromethyl-2,4-diaminobenzene, trifluoromethyl-3,5-diaminobenzene, 2,2-bis-(4-aminophenyl) propane, 4,4'-diaminodiphenylmethane, 4,4'-diaminodiphenyl sulfide, 4,4'-diaminodiphenyl sulfone, 3,3'-diaminodiphenyl sulfone, bis-(4-(4-aminophenoxy)phenyl sulfone, 4,4'-bis-(aminophenoxy)biphenyl, 3,4'-diaminodiphenyl ether, 4,4'-diaminobenzophenone, 4,4'-isopropylidenedianiline, 2,2'-bis-(3-aminophenyl)propane, N,N-bis-(4-aminophenyl)-n-butylamine, N,N-bis-(4-aminophenyl) methylamine, m-amino benzoyl-p-amino anilide, N,N-bis-(4-aminophenyl) aniline, 2,4-diaminotoluene, 2,6-diaminotoluene, 2,4-diamine-5-chlorotoluene, 2,4-diamine-6-chlorotoluene, 2,4-bis-(beta-amino-t-butyl) toluene, bis-(p-beta-amino-t-butyl phenyl) ether, p-bis-2-(2-methyl-4-aminopentyl) benzene, m-xylylene diamine, p-xylylene diamine, 1,2-bis-(4-aminophenoxy)benzene, 1,3-bis-(4-aminophenoxy) benzene, 1,2-bis-(3-aminophenoxy)benzene, 1,3-bis-(3-aminophenoxy) benzene, 1-(4-aminophenoxy)-3-(3-aminophenoxy) benzene, 1,4-bis-(4-aminophenoxy) benzene, 1,4-bis-(3-aminophenoxy) benzene, 1-(4-aminophenoxy)-4-(3-aminophenoxy) benzene, 2,2-bis-(4-[4-aminophenoxy]phenyl) propane, 2,2'-bis-(4-aminophenyl)-hexafluoro propane, 2,2'-bis-(4-phenoxy aniline) isopropylidene, 4,4'-diamino-2,2'-trifluoromethyl diphenyloxide, 3,3'-diamino-5,5'-trifluoromethyl diphenyloxide, 4,4'-trifluoromethyl-2,2'-diaminobiphenyl, 2,4,6-trimethyl-1,3-diaminobenzene, 4,4'-oxy-bis-[2-trifluoromethyl) benzene amine], 4,4'-oxy-bis-[3-trifluoromethyl) benzene amine], 4,4'-thio-bis-[(2-trifluoromethyl) benzene-amine], 4,4'-thiobis[(3-trifluoromethyl) benzene amine], 4,4'-sulfoxyl-bis-[(2-trifluoromethyl)benzene amine, 4,4'-sulfoxyl-bis-[(3-trifluoromethyl)benzene amine], and 4,4'-keto-bis-[(2-trifluoromethyl)benzene amine] and mixtures thereof;
a core layer comprising a polyimide consisting of a polyimide composition derived from an aromatic dianhydride comprising a first aromatic dianhydride comprising 3,3',4,4'-biphenyl tetracarboxylic dianhydride and an aromatic diamine selected from the group consisting of p-phenylenediamine, 2,5-dimethyl-1,4-diaminobenzene, 2,5-dimethyl-1,4-phenylenediamine, 4,4'-diaminobiphenyl, 4,4'-diaminobenzophenone, 4,4'-diaminodiphenyl ether, 1,5-diaminonaphthalene, 3,3'-dimethyl-4,4'-diaminobiphenyl, 4-aminophenyl-3-aminobenzoate, 2,5-diaminotoluene, 2,2'-bis(trifluoromethyl) benzidine, 2,4,6-trimethyl-1,3-diaminobenzene, and mixtures thereof; and
a second outer layer comprising a second thermoplastic polyimide consisting of a polyimide composition derived from:
an aromatic dianhydride; and
an aromatic diamine selected from the group consisting of m-phenylenediamine, trifluoromethyl-2,4-diaminobenzene, trifluoromethyl-3,5-diaminobenzene, 2,2-bis-(4-aminophenyl) propane, 4,4'-diaminodiphenylmethane, 4,4'-diaminodiphenyl sulfide, 4,4'-diaminodiphenyl sulfone, 3,3'-diaminodiphenyl sulfone, bis-(4-(4-aminophenoxy)phenyl sulfone, 4,4'-bis-(aminophenoxy)biphenyl, 3,4'-diaminodiphenyl ether, 4,4'-diaminobenzophenone, 4,4'-isopropylidenedianiline, 2,2'-bis-(3-aminophenyl)propane, N,N-bis-(4-aminophenyl)-n-butylamine, N,N-bis-(4-aminophenyl) methylamine, m-amino benzoyl-p-amino anilide, N,N-bis-(4-aminophenyl)

aniline, 2,4-diaminotoluene, 2,6-diaminotoluene, 2,4-diamine-5-chlorotoluene, 2,4-diamine-6-chlorotoluene, 2,4-bis-(beta-amino-t-butyl) toluene, bis-(p-beta-amino-t-butyl phenyl) ether, p-bis-2-(2-methyl-4-aminopentyl) benzene, m-xylylene diamine, p-xylylene diamine, 1,2-bis-(4-aminophenoxy)benzene, 1,3-bis-(4-aminophenoxy) benzene, 1,2-bis-(3-aminophenoxy)benzene, 1,3-bis-(3-aminophenoxy) benzene, 1-(4-aminophenoxy)-3-(3-aminophenoxy) benzene, 1,4-bis-(4-aminophenoxy) benzene, 1,4-bis-(3-aminophenoxy) benzene, 1-(4-aminophenoxy)-4-(3-aminophenoxy) benzene, 2,2-bis-(4-[4-aminophenoxy]phenyl) propane, 2,2'-bis-(4-aminophenyl)-hexafluoro propane, 2,2'-bis-(4-phenoxy aniline) isopropylidene, 4,4'-diamino-2,2'-trifluoromethyl diphenyloxide, 3,3'-diamino-5,5'-trifluoromethyl diphenyloxide, 4,4'-trifluoromethyl-2,2'-diaminobiphenyl, 2,4,6-trimethyl-1,3-diaminobenzene, 4,4'-oxy-bis-[2-trifluoromethyl) benzene amine], 4,4'-oxy-bis-[3-trifluoromethyl) benzene amine], 4,4'-thio-bis-[(2-trifluoromethyl) benzene-amine], 4,4'-thiobis[(3-trifluoromethyl) benzene amine], 4,4'-sulfoxyl-bis-[(2-trifluoromethyl)benzene amine, 4,4'-sulfoxyl-bis-[(3-trifluoromethyl)benzene amine], and 4,4'-keto-bis-[(2-trifluoromethyl)benzene amine] and mixtures thereof; wherein:

the multilayer film has a total thickness in a range of from 5 to 150 µm, a transmission of at least 50% and a haze of less than 30%;

a thickness of the core layer is in a range of from 35 to 73% of the total thickness of the multilayer film; and a minimum peel strength for at least one of the first and second outer layers, when adhered to copper foil and tested following ASTM method IPC-TM-650, method No. 2.4.9B, is greater than 0.9 kgf/cm (0.88 N/mm).

2. The multilayer film of claim 1, wherein:

the aromatic dianhydride of the first thermoplastic polyimide is selected from the group consisting of 4,4'-oxydiphthalic dianhydride, pyromellitic dianhydride, 3,3',4,4'-biphenyl tetracarboxylic dianhydride, 3,3',4,4'-benzophenone tetracarboxylic dianhydride and mixtures thereof; and the aromatic diamine of the first thermoplastic polyimide is selected from the group consisting of 1,3-bis(4-aminophenxoxy) benzene, 2,2-bis-(4-[4-aminophenoxy]phenyl) propane and mixtures thereof.

3. The multilayer film of claim 2, wherein:

the aromatic dianhydride of the first thermoplastic polyimide is a mixture of pyromellitic dianhydride and 4,4'-oxydiphthalic dianhydride; and the aromatic diamine of the first thermoplastic polyimide is 1,3-bis(4-aminophenoxy) benzene.

4. The multilayer film of claim 1, wherein:

the aromatic dianhydride of the second thermoplastic polyimide is selected from the group consisting of 4,4'-oxydiphthalic dianhydride, pyromellitic dianhydride, 3,3',4,4'-biphenyl tetracarboxylic dianhydride, 3,3',4,4'-benzophenone tetracarboxylic dianhydride and mixtures thereof; and the aromatic diamine of the second thermoplastic polyimide is selected from the group consisting of 1,3-bis (4-aminophenxoxy) benzene, hexamethylene diamine and mixtures thereof.

5. The multilayer film of claim 4, wherein:

the aromatic dianhydride of the second thermoplastic polyimide is a mixture of pyromellitic dianhydride and 4,4'-oxydiphthalic dianhydride; and the aromatic diamine of the second thermoplastic polyimide is 1,3-bis(4-aminophenoxy) benzene.

6. The multilayer film of claim 1, wherein the polyimide compositions of the first and second thermoplastic polyimides are the same.

7. The multilayer film of claim 1, wherein the aromatic dianhydride of the core layer further comprises a second aromatic dianhydride.

8. The multilayer film of claim 7, wherein the second aromatic dianhydride is selected from the group consisting of 4,4'-oxydiphthalic dianhydride, pyromellitic dianhydride, 3,3',4,4'-benzophenone tetracarboxylic dianhydride, bisphenol A dianhydride, 1,2,5,6-naphthalene tetracarboxylic dianhydride, 1,4,5,8-naphthalene tetracarboxylic dianhydride, and 2,3,6,7-naphthalene tetracarboxylic dianhydride.

9. The multilayer film of claim 1, wherein the aromatic diamine of the core layer is p-phenylenediamine.

10. The multilayer film of claim 1, wherein the aromatic diamine of the core layer is a mixture of p-phenylenediamine and an aromatic diamine selected from the group consisting of 4,4'-diaminodiphenyl ether, 3,4'-diaminodiphenyl ether, 2,2'-bis(trifluoromethyl) benzidine, m-phenylenediamine and 4,4'-diaminodiphenylmethane.

11. The multilayer film of claim 1, wherein the polyimide composition of the core layer comprises a mixture of aromatic dianhydrides and a mixture of aromatic diamines.

12. The multilayer film of claim 1, wherein the polyimide composition of the core layer comprises at least 80 mole percent 3,3',4,4'-biphenyl tetracarboxylic dianhydride based on a total dianhydride content of the polyimide and at least 80 mole percent p-phenylenediamine based on a total diamine content of the polyimide.

13. The multilayer film of claim 1, wherein the multilayer film has a coefficient of thermal expansion of less than 25 µm/(meter-° C.) over a temperature in the range of from 50 to 400° C.

14. The multilayer film of claim 1, wherein the first thermoplastic polyimide and the second thermoplastic polyimide each have a $T_g$ in the range of from 150 to 320° C.

15. The multilayer film of claim 1, wherein the total thickness of the multilayer film is in a range of from 5 to 75 µm.

16. The multilayer film of claim 1, wherein the minimum peel strength of each of the first and second outer layers is greater than 0.9 kgf/cm (0.88 N/mm).

17. The multilayer film of claim 1, wherein the thickness of the core layer is in the range of from 55 to 73% of the total thickness of the multilayer film.

18. A metal-clad laminate comprising the multilayer film of claim 1 and a first metal layer adhered to an outer surface of the first outer layer of the multilayer film.

19. The metal-clad laminate of claim 18, further comprising a second metal layer adhered to an outer surface of the second outer layer of the multilayer film.

* * * * *